United States Patent [19]

Kazama

[11] Patent Number: 5,004,977
[45] Date of Patent: Apr. 2, 1991

[54] CONTACT PROBE

[75] Inventor: Toshio Kazama, Kanagawa, Japan

[73] Assignee: NHK Spring Co., Ltd., Yokohama, Japan

[21] Appl. No.: 424,511

[22] Filed: Oct. 20, 1989

[30] Foreign Application Priority Data

Oct. 24, 1988 [JP] Japan ............................ 63-138376[U]
Mar. 3, 1989 [JP] Japan ............................... 1-24651[U]
May 1, 1989 [JP] Japan .................................. 1-112691

[51] Int. Cl.$^5$ ........................ G01R 1/06; G01R 31/02
[52] U.S. Cl. ................................ 324/158 P; 324/72.5
[58] Field of Search ............... 324/158 P, 158 F, 72.5, 324/73.1

[56] References Cited

U.S. PATENT DOCUMENTS

| | | | |
|---|---|---|---|
| 4,658,212 | 4/1987 | Ozawa et al. | 324/158 P |
| 4,659,987 | 4/1987 | Coe et al. | 324/72.5 |
| 4,837,507 | 6/1989 | Hechtman | 324/158 P |
| 4,841,240 | 6/1989 | Hsue et al. | 324/158 P |

Primary Examiner—Ernest F. Karlsen
Attorney, Agent, or Firm—Jeffers, Hoffman & Niewyk

[57] ABSTRACT

A contact probe, comprising: an electroconductive needle member; a tubular holder slidable receiving the needle member; a compression coil spring fitted on the needle member in the tubular holder to urge the needle member so as to project a forward end of the needle member from one end of the tubular holder; a stopper arrangement for restricting the extent to which the forward end of the needle member projects from the one end of the tubular holder; and a lead wire preferably continuous and integral with the needle member for electrically connecting the needle member to an external circuit. Owing to the use of the compression coil spring which may extend substantially the entire length of the contact probe, a favorable spring property can be obtained. The use of the compression coil spring surrounding the needle member permits generation of a large spring force, and the outer diameter of the contact probe is not required to be increased.

5 Claims, 12 Drawing Sheets

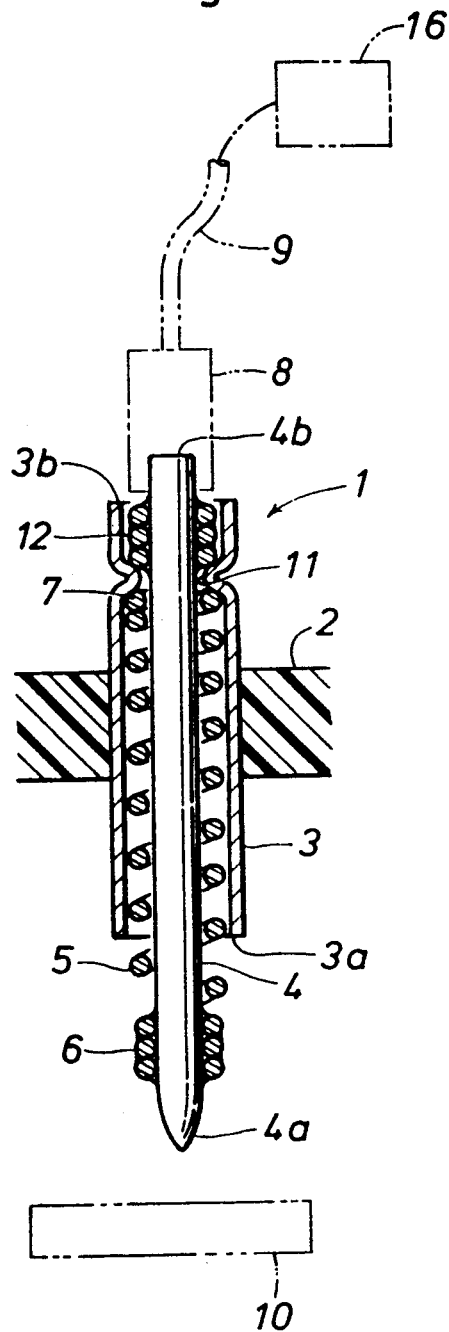
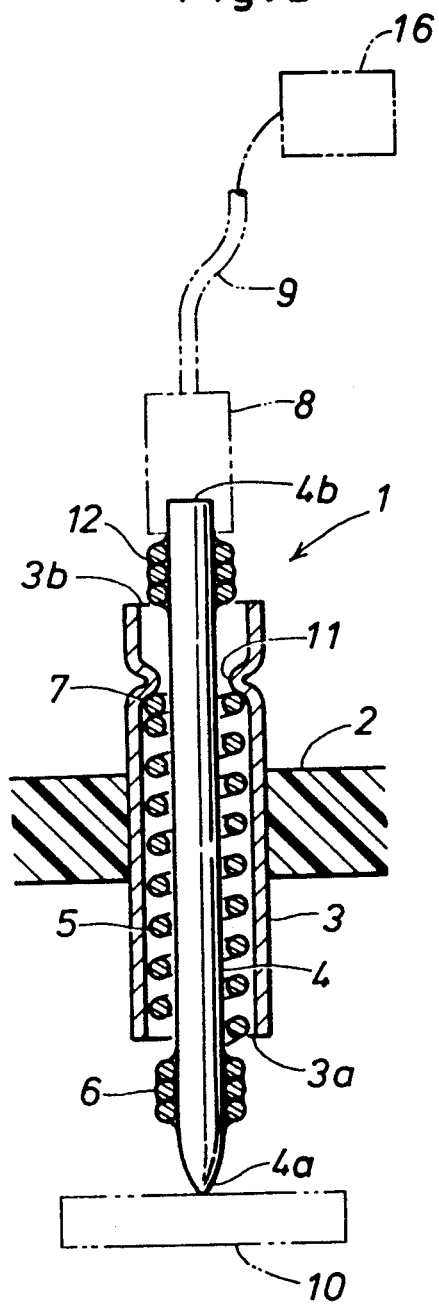

Fig.5
Fig.6
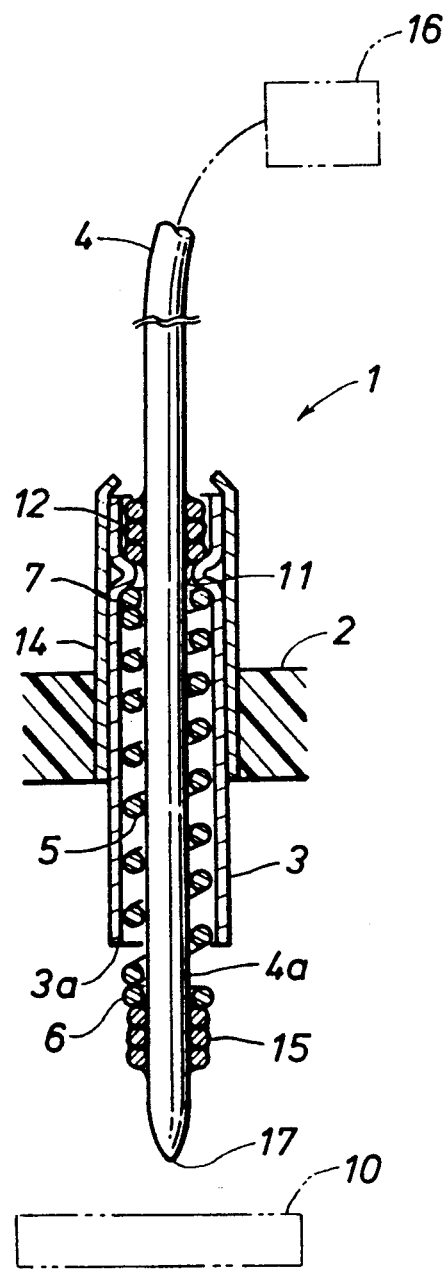
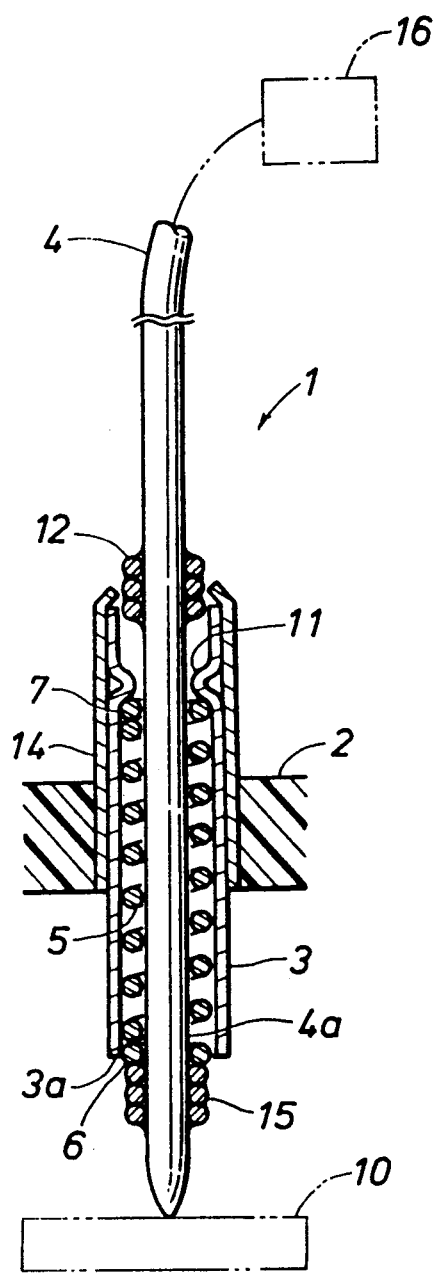

Fig.16
Fig.17
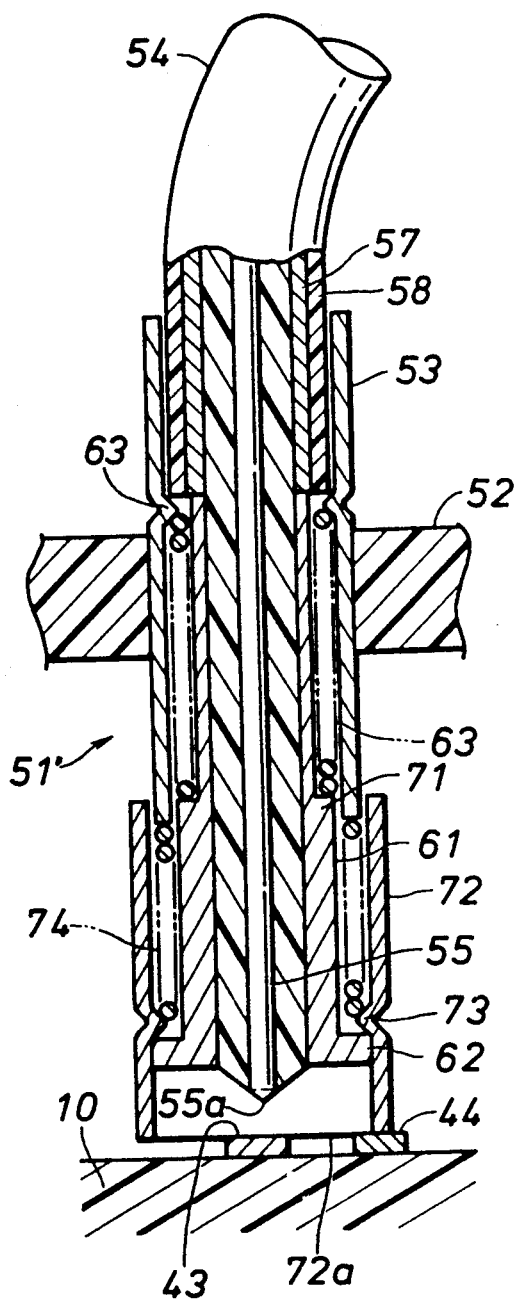
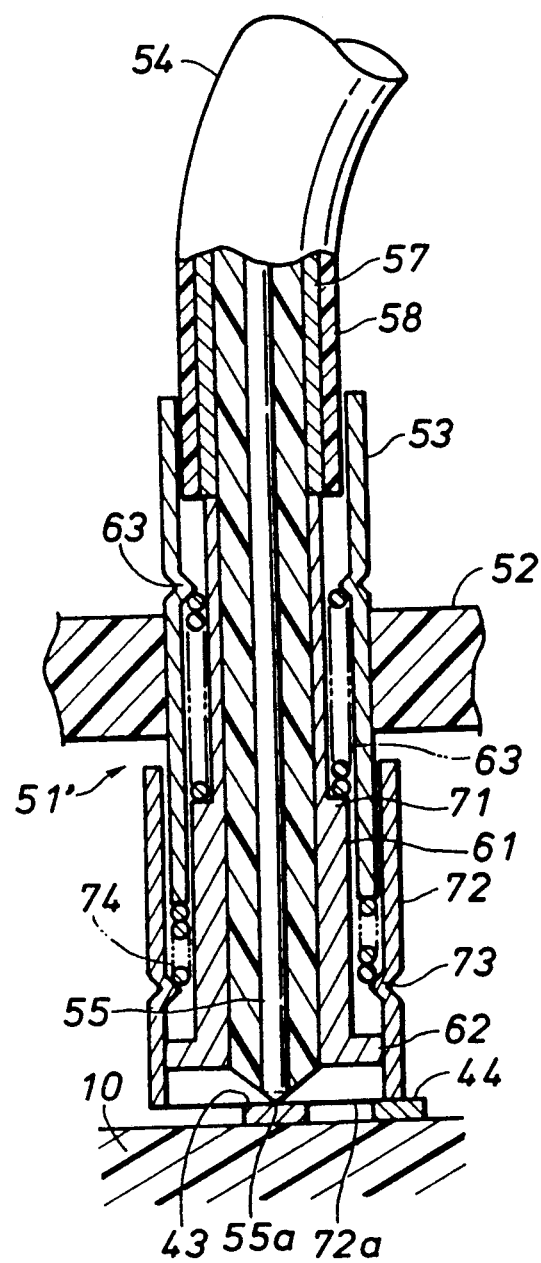

Fig.21
Fig.22
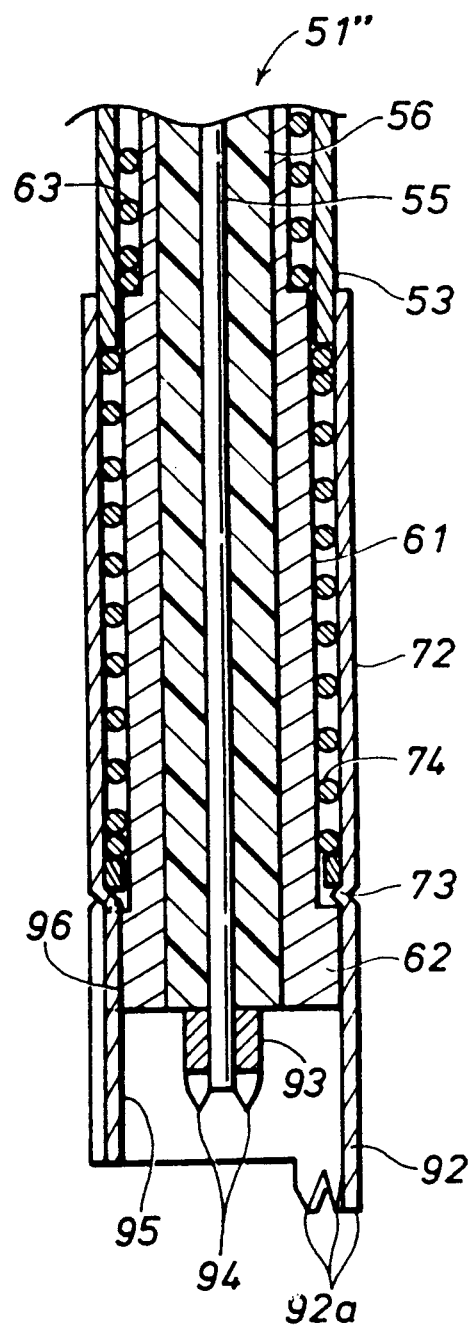
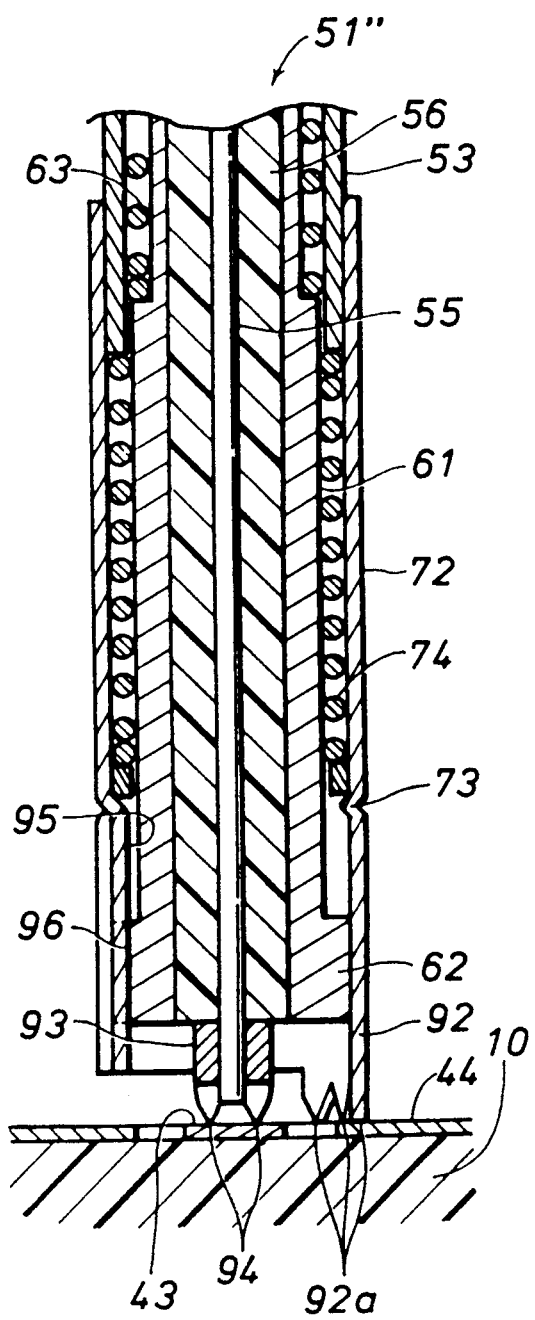

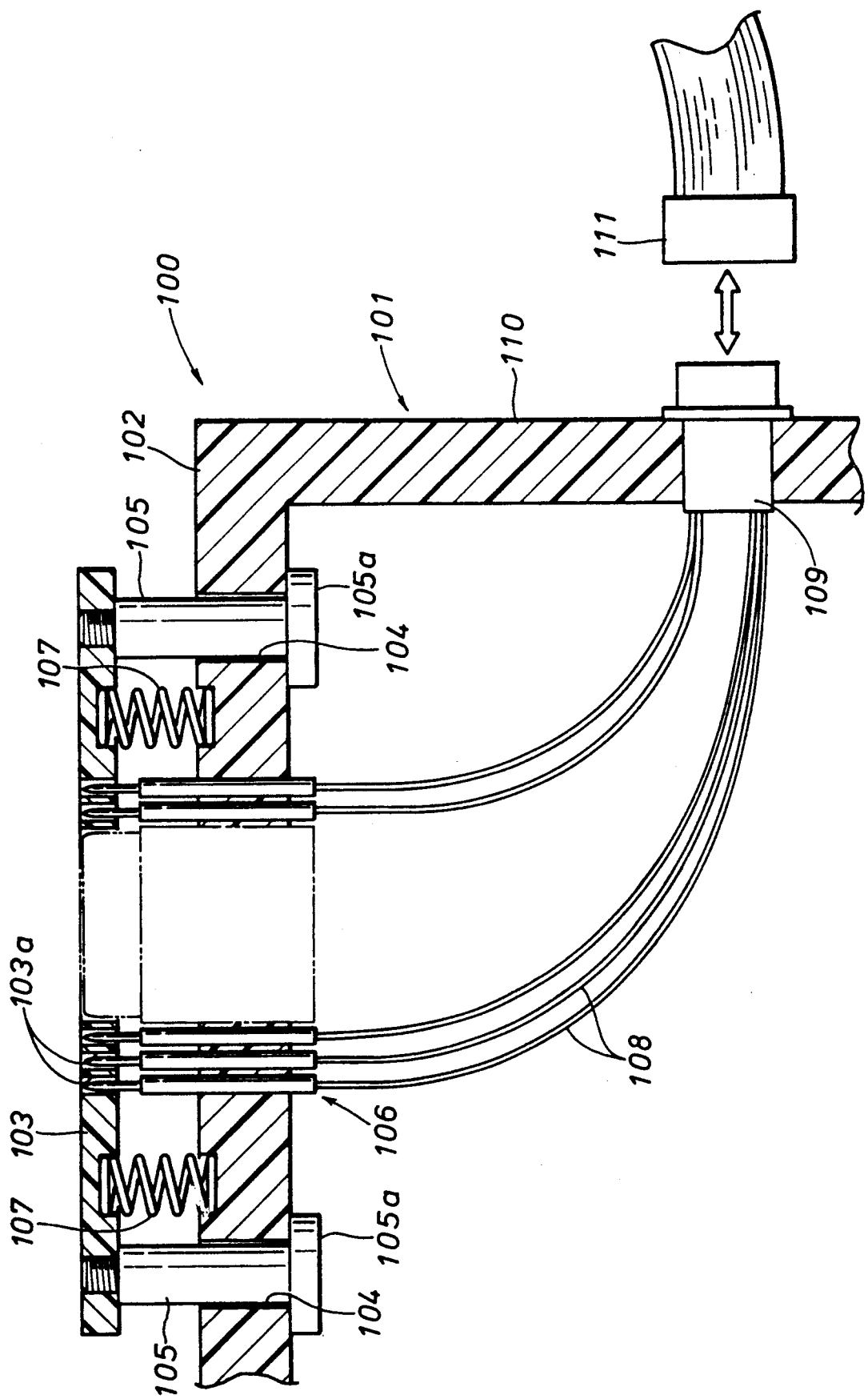

CONTACT PROBE

TECHNICAL FIELD

The present invention relates to spring-loaded contact probes which are typically used for inspecting electronic devices and electronic circuits by electrically contacting desired points of electronic devices and circuits.

BACKGROUND OF THE INVENTION

In modern facilities for manufacturing electronic products such as semiconductor devices and electronic systems, contact probe heads carrying a large number of contact probes and carried by a robot hand are widely used for inspecting electric performance of such electronic products by electrically accessing a large number of points of such electronic products. These contact probes are required to be extremely densely arranged so as to be able to access a large number of points of an extremely small electronic device.

FIG. 7 shows a conventional contact probe. In this contact probe 23, a tubular holder 21 is passed through and fixedly secured to a base board 22, and the tubular holder 23 receives a needle member 24 therein. A lower part or a rear part of the tubular holder 23 is crimped inwards so as to define a small diameter portion or an annular shoulder 27 which cooperates with a reduced diameter portion 28 provided in a middle part of the needle member 24 to restrict the range over which the needle member 24 can move. The front end of the needle member 24 projects from an end of the tubular holder 23, and a coil spring 25 is interposed between the rear end of the needle member 24 and the other end of the tubular holder 23 which is also crimped inwards. The upper end or the rear end of the tubular holder 23 is connected to a lead wire 26 leading to a testing circuit not shown in the drawing.

According to this prior art contact probe 21, since the compression coil spring 25 is disposed in series with the needle member 24, the overall diameter of the contact probe 21 can be minimized. However, since the length of the compression coil spring 25 is relatively small for a given length of the contact probe 21, the biasing force of the needle member 24 changes significantly as the needle member 24 is displaced. Also, to obtain a sufficient biasing force, the wire diameter and the coil diameter of the compression coil spring 25 must be increased, and this offsets the achieved reduction in the outer diameter of the contact probe.

Furthermore, the needle member is desired to be made of hard material such as tungsten or tungsten alloys, but such materials are often unsuitable for machining. Therefore, provision of a small diameter portion 28 in the needle member 24 could present a manufacturing problem.

Generally speaking, to achieve a high density, the structure of each contact prob. is desired to be as simple as possible. Further, in order to control the contact pressure of such a contact probe, it is desired to increase the stroke of the contact member for a given length of the contact probe.

In some applications which require elimination of spurious noises, the contact member needs to be shielded over its entire length. This requirement tends to increase the complexity of the contact probe, and, hence, the dimensions of the contact probe.

BRIEF SUMMARY OF THE INVENTION

In view of such problems of the prior art, a primary object of the present invention is to provide a contact probe which is suitable for compact design.

A second object of the present invention is to provide a contact probe whose contact pressure can be favorably controlled.

A third object of the present invention is to provide a contact probe whose contact member is favorably shielded from spurious noises.

These and other objects of the present invention can be accomplished by providing a contact probe, comprising: an electroconductive needle member; a tubular holder slidable receiving the needle member; spring means urging the needle member so as to project a forward end of the needle member from one end of the tubular holder; stopper means for restricting the extent to which the forward end of the needle member projects from the one end of the tubular holder; and lead means for electrically connecting the needle member to an external circuit; the spring means consisting of a compression coil spring fitted on the needle member in the tubular holder and engaged with a part of the tubular holder remote from the one end thereof at its one end and with a part of the needle member adjacent the forward end thereof at its other end.

Owing to the use of the compression coil spring which may extend substantially over the entire length of the contact probe, a favorable spring property can be obtained. The use of the compression coil spring surrounding the needle member permits generation of a large spring force, and the outer diameter of the contact probe is not required to be increased.

According to a preferred embodiment of the present invention, the lead means consists of a continuous and integral extension of the needle member with the aim of reducing the internal resistance of the contact probe. When spurious noises are required to be removed, the needle member may consist of a shielded cable or an equivalent thereof.

According to a structurally favorable embodiment, the other end of the compression coil spring is tightly wrapped around the needle member to securely engage the other end of the compression coil spring with the needle member. The stopper means may be likewise formed by a coil of wire which is securely fitted on the needle member and a stopper portion of the tubular holder formed as an annular shoulder. More favorably, the stopper member consists of a wire tightly wrapper around the needle member.

When the needle member consists of a shielded cable such as a coaxial cable, a metallic sleeve may be fitted on a part of the sheath adjacent the forward end of the needle member, and is provided with an annular shoulder for engaging the other end of the compression coil spring.

When it is desired to minimize the outer diameter of the contact probe, the insulator may consist of a surface coating deposited on the outer surface of the needle member, and the shield may also consist of another surface coating deposited on the outer surface of the electrically insulating sheath. The shield may be electrically in contact with or insulated from the metallic sleeve as desired.

The contact probe may be additionally equipped with an outer metallic sleeve slidable supported by the tubular holder by way of spring means urging the outer metallic sleeve forwardly and stopper means limiting the extent to which the outer metallic sleeve projects forward so that two points may be accessed by the contact probe at the same time. Typically, one of the accessed points electrically connected to the shield consists of a ground line, and the outer metallic tube is guided along its longitudinal direction by means of sliding contact with the tubular holder and/or the inner metallic sleeve. In order to ensure a reliable contact, the outer metallic tube may be provided with at least one pointed front end adapted for electric contact with an external part, and/or a crown shaped member having a plurality of pointed ends at its front axial end and fixedly fitted onto the exposed end of the needle member.

BRIEF DESCRIPTION OF THE DRAWINGS

Now the present invention is described in the following in terms of specific embodiments with reference to the appended drawings, in which:

FIG. 1 is a sectional view of a first embodiment of the contact probe according to the present invention;

FIG. 2 is a view similar to FIG. 1 showing the state of the first embodiment when its needle member is brought into contaCt with an article to be tested such as a printed circuit board;

FIG. 5 is a view similar to FIG. 1 showing a fourth embodiment of the contact probe according to the present invention;

FIG. 6 is a view similar to FIG. 2 showing the state of the fourth embodiment in which the needle member is brought into contact with a printed circuit board;

FIGS. 15 through 17 are vertical sectional views of a ninth embodiment of the present invention in three different states;

FIGS. 21 and 22 are vertical sectional views of an twelfth embodiment of the present invention in two different states;

FIG. 25 is a sectional view of a contact probe head which may carry the contact probes of the present invention.

DETAILED DESCRIPTION OF THE PREFERRED EMBODIMENTS

Figure 3:
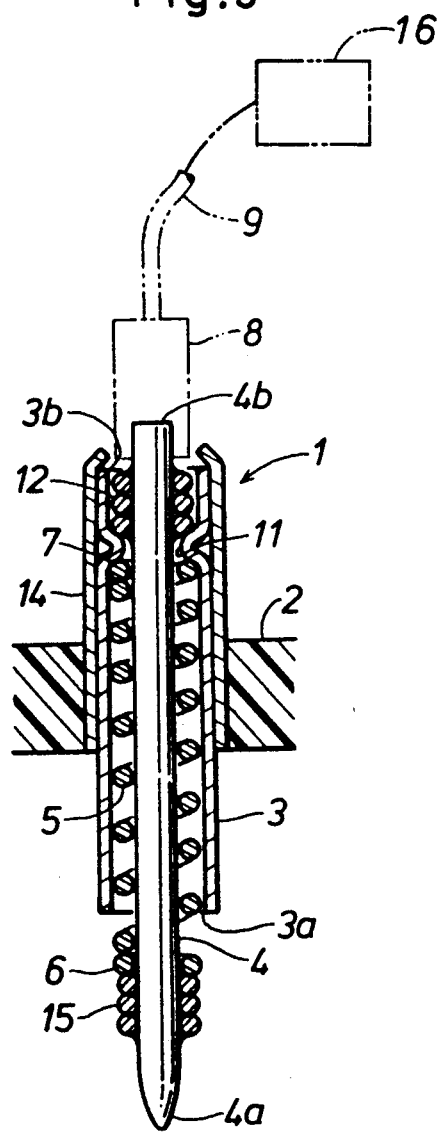
FIG. 3 is a view similar to FIG. 1 showing a second embodiment of the present invention in which an external tube is used for mounting this contact probe on a base board, and one end of the coil spring is engaged with the needle member by means of a separate wire wrapped around the needle member.

FIG. 1 shows a first embodiment of the contact probe according to the present invention. This contact probe 1 comprises a tubular holder 3 passed through and fixedly secured to a base board 2, and a needle member 4 slidably received in the tubular holder 3. Typically, an array of such contact probes are provided in a contact probe head carried by a robot arm.

The needle member 4 typically consists of a straight wire of a hard metal or alloy such as tungsten alloys and high-speed steels, and its front end 4a projecting from the front end 3a of the tubular holder 3 is finished as a sharply pointed end so that a reliable electric contact may be achieved with an article to be tested such as a circuit board. A compression coil spring 5 made of nickel plated steel is wound around the needle member 4, and its one end 6 is tightly wrapped around a part of the needle member 4 adjacent to its front end 4a. Additional bonding means such as brazing, soldering, application of a bonding agent, etc. may be applied thereto to securely attach this one end 6 of the compression coil spring 5 to the needle member 4. The rear end 4b of the needle member 4 slightly projects from the rear end 3b of the tubular holder 3. A part of the tubular holder 3 adjacent its rear end 3b is locally reduced in diameter to define an annular shoulder 11 which engages the other end or the rear end of the compression coil spring 5. A stopper 12 consisting of a coil of wire is tightly wrapped around a rear end portion of the needle member 4, and is optionally soldered, crimped or otherwise positively secured to the needle member 4. As shown in FIG. 1, the needle member 4 is urged by the compression spring 5 in such a manner that its front end 4a projects from the front end 3a of the tubular holder 3 to the extent permitted by the engagement of the stopper 12 by the annular shoulder 11 of the tubular holder 3, and the compression coil spring 5 is kept compressed in the neutral state of the contact probe 1. A cap 8 is fitted on the rear end 4b of the needle member 4 to establish an electric contact of the needle member 4 with an external circuit 16 such as a testing circuit via a lead wire 9 attached to the cap 8.

When the front end 4a of the needle member 4 is pressed against a part of a printed circuit board 10, the needle member 4 is pushed rearward into the tubular holder 3 against the biasing force of the compression coil spring 5 as shown in FIG. 2. Thus, a sufficient contact pressure is ensured between the needle member 4 and the printed circuit board 10 by the biasing force of the compression coil spring 5. Since the lead wire 9 is electrically connected to the needle member 4 via the cap 8 without involving any sliding or abutting contact between the needle member 4 and the lead wire 9, a stable electric connection is always maintained.

According to this embodiment, since the needle member 4 is subjected to an initial loading by the compression coil spring 5 which is already compressed in the neutral state, not only the initial position of the front end 4a of the needle member 4 is stabilized but also the change in the biasing force of the needle member 4 is kept small as the needle member 4 is pushed into the tubular holder 3 against the biasing force of the compression coil spring 5. Also, since the compression coil spring 5 is wound around the needle member 4 substantially over its entire length, a sufficient spring force can be obtained even when the wire diameter and the coil diameter of the compression coil spring are relatively small, and the stroke of the needle member is relatively large for a given length of the contact probe. Since the tubular holder 3 guides and protects the needle member 4, an extremely fine needle member may be used. This is important as such contact probes are required to be mounted by a large number in a limited space, and relatively narrow parts are required to be accessed by such contact probes. According to a certain application of the present invention, the diameter of the tubular retainer was approximately 0.5 mm, and the diameter of the needle member was 0.15 mm.

FIG. 3 shows a second embodiment of the present invention. This second embodiment is different from the first embodiment in that the tubular holder 3 is passed through and fixedly secured to the base board 2 by way of a tubular retainer 14 which is in turn passed through and fixedly secured to the base board 2. The tubular holder 3 and the tubular retainer 14 may consist of gold plated white gold. Also, in this embodiment, a coil of wire is tightly wrapped around a part of the needle member 4 adjacent its front end 4a as a stopper 15 instead of tightly wrapping an end of the compression coil spring 5 around the needle member 4. Thus, the compression coil spring 5 is engaged between the annular shoulder 11 and this stopper 15 made of a coil of wire.

Figure 4:
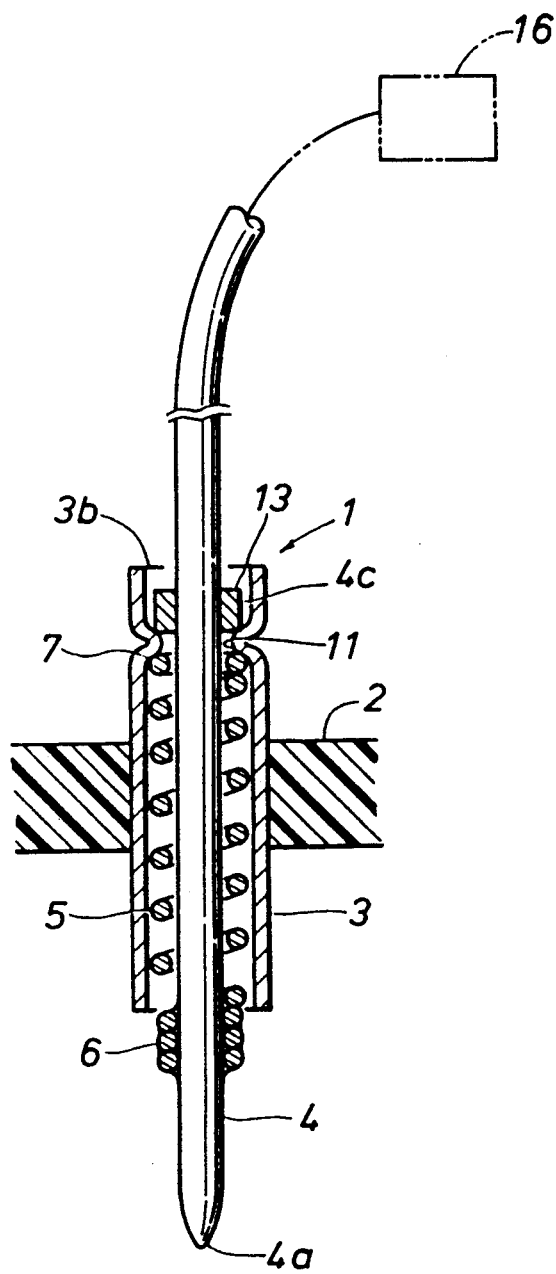
FIG. 4 is a view similar to FIG. 1 showing a third embodiment of the present invention in which the needle member is integral with the lead wire for electrically connecting the needle member to an external circuit.
Figure 7:
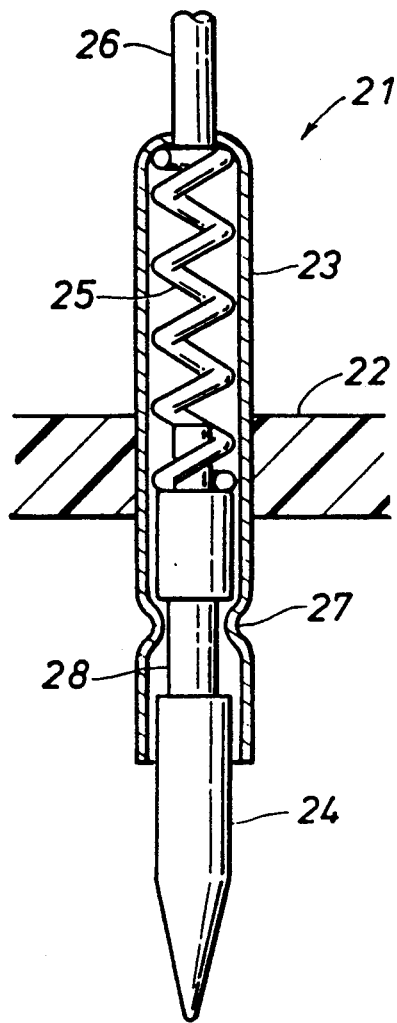
FIG. 7 is a vertical sectional view of a conventional contact probe.

FIG. 4 shows a third embodiment of the present invention. In this embodiment, a long wire member is used as a needle member 4 so that a continuous and integral extension thereof may be used as a lead wire without using any electric coupling means such as the cap 8 of the preceding embodiments. Otherwise, the present embodiment is similar to the preceding embodiments. Since the entire electric path of this contact probe, from the needle member to the lead wire, consists of a single wire member and there is, hence, no contact couplings in its electric path, a contact probe having an extremely low internal resistance can be obtained. In this embodiment, the stopper 13 at the rear end of the needle member consists of an annular member which is fitted on the needle member 4 and securely crimped thereon.

FIGS. 5 and 6 shows a fourth embodiment in its neutral state and in its activated state, respectively. This embodiment is similar to the previous embodiment in that the needle member is integral with the lead wire, but differs therefrom in that the tubular holder 3 is secured to the base board 2 by way of a tubular retainer 14 and the front end of the compression coil spring 5 is engaged with a front end portion of the needle member 4 by means of a stopper 15 consisting of a separate coil of wire which is tightly wrapped around the needle member 4 and is brazed thereto for added strength.

Figure 8:
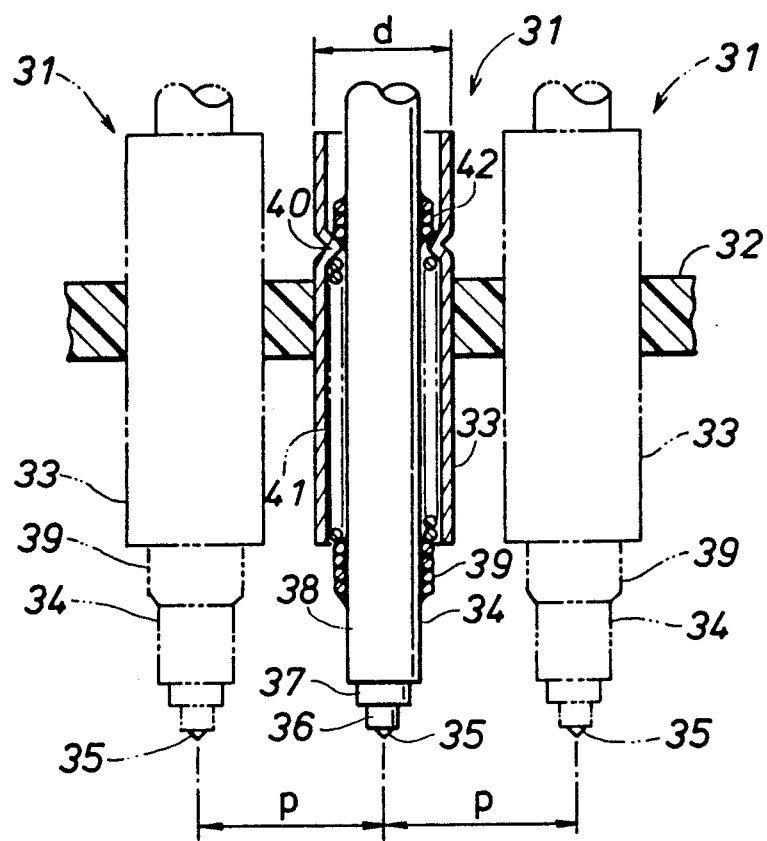
FIG. 8 is a vertical sectional view of a fifth embodiment of the present invention as a part of an array of contact probes arranged at the pitch P.
Figure 9:
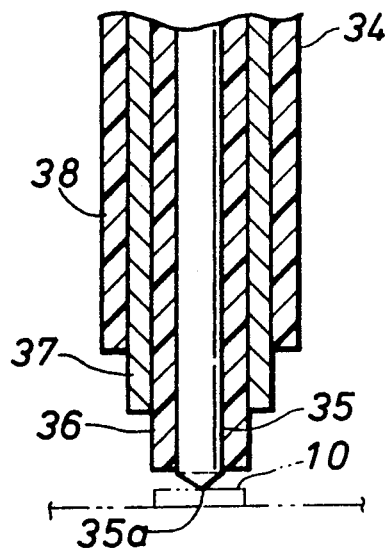
FIG. 9 is an enlarged sectional view of the contact probe according to the fifth embodiment of the present invention.

FIGS. 8 and 9 show a fifth embodiment of the present invention. A base board 32 which forms a part of an automatic testing system not shown in the drawings retains a plurality of tubular holders 33 of the contact probes 31 which are passed through the base board 32. As illustrated in FIG. 8, the base board 32 carries a plurality of such identical holders at the pitch of P, and an end of a cable 34 formed as a normal coaxial cable is passed through each of these tubular holders 33

The cable 34 comprises a core wire 35 consisting of low-resistivity, wear-resistant and high-rigidity metallic material, such as tungsten, an insulating layer 36 made of insulating material deposited on the outer circumferential surface of the core wire 35 by CVD, PVD, or other surface coating means, an outer conductor 37 consisting of electro-conductive material deposited on the surface of the insulating layer 35 by CVD, PVD, or other surface coating means, and an external sheath 38 which is also made of insulating material deposited on the surface of the outer conductor 37 by suitable surface coating means. As these layers are formed by deposition or other surface coating process are therefore extremely thin, the outer diameter of the cable 34 can be substantially reduced for a given outer diameter of the core wire 35 as compared with conventional shielded cables and coaxial cables.

As best shown in FIG. 9, the lower end or the front end of the cable 34 projecting from the front end of the tubular holder 33 is shaped as annular steps with an inner part projecting more than the part surrounding it. A coil of wire made of nickel plated steel and serving as a stopper 39 is wrapped tightly around a part of the sheath 38 adjacent its front end. A part of the tubular holder 33 adjacent its upper end or its rear end is provided with an annular shoulder 40 by locally reducing the diameter of the tubular holder 33. A compression coil spring 41 is wound around the cable 34 in compressed state between this annular shoulder 33 and the stopper 39, thereby urging the cable 34 downwards. The downward movement of the cable 34 is limited by the engagement between the annular shoulder 40 and another stopper 42 consisting of a coil of wire tightly wrapped around the cable 34 above or behind the annular shoulder 40 as shown in FIG. 8. Thus, this stopper 42 not only limits the extent to which the cable 34 projects from the front end of the tubular holder 33 but also keeps the compression coil spring 34 in compressed state or in pre-stressed state at all time. The other end of the cable 34 is connected to a testing circuit which is not shown in the drawing.

This embodiment also has the advantages in that the initial position of the tip 35a of the core wire 35 is stabilized and the changes in the biasing force of the cable 34 is minimized for a given displacement of the cable 34 with respect to the tubular holder 33 owing to the initially stressed state of the compression coil spring 41, and that an extremely low internal resistance can be achieved as the electric path from the tip 35a of the core wire 35 to the testing circuit is formed by a single continuous member.

Additionally, according to this embodiment, since the various layers are formed by vapor deposition or other similar process and can be made extremely thin, a desired electromagnetic shielding can be achieved without increasing the diameter of the cable. This is advantageous when a point in a crowded part is to be accessed and the contact probe is a part of an array of contact probes arranged in a high density. In particular, by forming the core wire with a high rigidity material such as tungsten, the diameter of the core wire 35 can be reduced without adversely affecting the operation of the contact probe, and this also contributes to the reduction in the diameter of the cable and hence the contact probe. The tip 35a of the core wire 35 may be finished as a pointed end, and may be gold plated in order to achieve a low resistance electric contact. Tungsten material is not suitable for gold electroplating but a gold layer may be deposited on its surface by other means such as chemical vapor deposition, ion plating, sputtering and so on.

Figure 10:
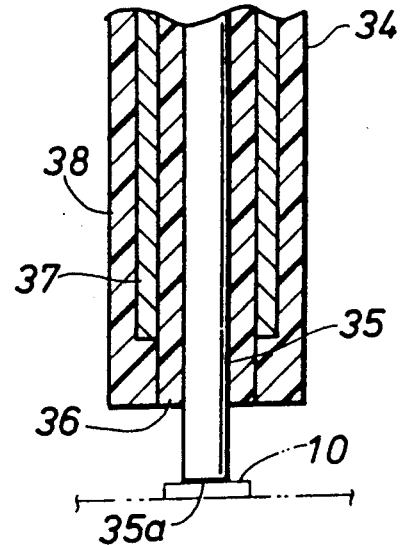
FIG. 10 is a view similar to FIG. 9 showing a sixth embodiment of the present invention.

FIG. 10 is a view similar to FIG. 9 showing a sixth embodiment of the present invention. In this case, the front end of the external conductor 37 is completely covered by the outer sheath 38 which defines a front end surface which is flush with that of the insulating layer 36. Therefore, according to this embodiment, inadvertent contact of the external conductor 37 with an external circuit can be avoided.

Figure 11:
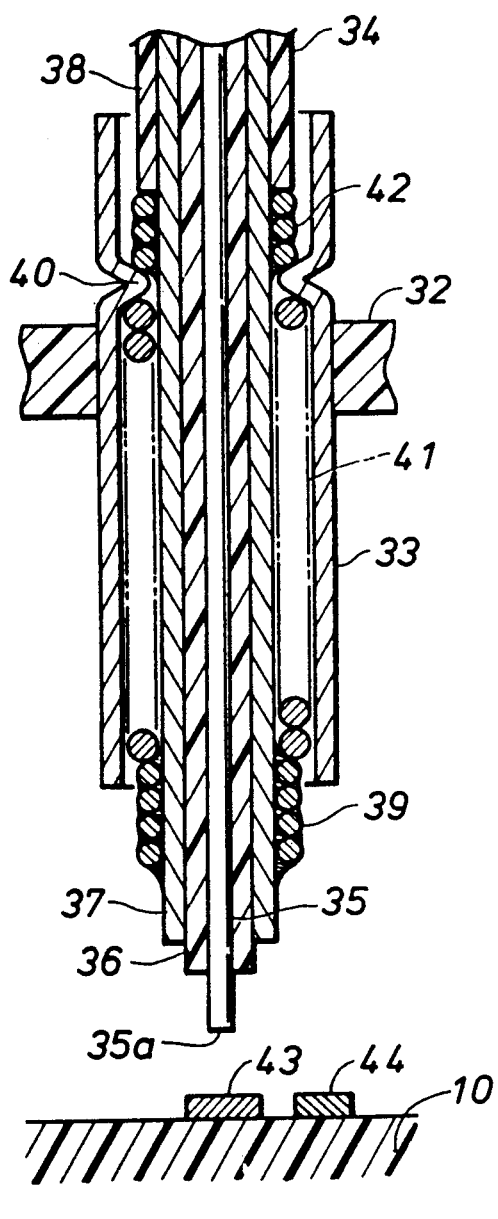
FIGS. 11 and 12 are vertical sectional views of a seventh embodiment of the present invention in two different states.
Figure 12:
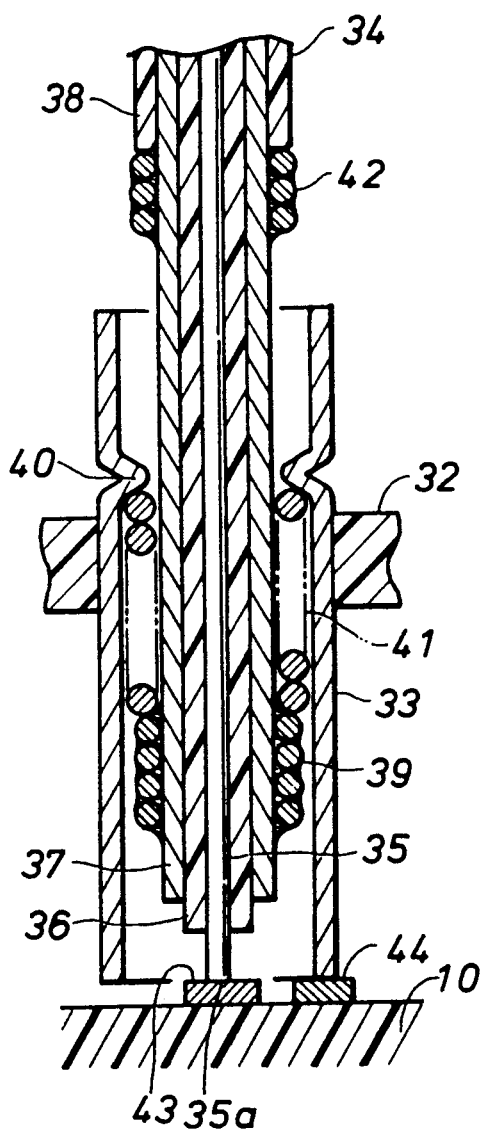

FIGS. 11 and 12 show a seventh embodiment of the present invention. According to this embodiment, the outer sheath 38 is removed from the part of the cable 34 over a certain length from its front end. A coil of wire serving as a stopper 39 is tightly wrapped around a front portion of the exposed part of the outer conductor 37, and another coil of wire also serving as a stopper 42 is tightly wrapped around a part of the outer conductor 37 in the rear end of its exposed part. A compression coil spring 41 is wrapped around the exposed part of the outer conductor 37 and is compressed between an annular shoulder 40 of the tubular holder 33 and the front stopper 39. The rear stopper 42 limits the extent to which the front end of the cable 34 projects from the front end of the tubular holder 33.

According to this embodiment, the outer conductor 37 is electrically connected with the tubular holder 33 via the stopper 39 and the compression coil spring 41, and two points 43 and 44 of a circuit board 10 to be tested can be accessed with its core wire 35 and tubular holder 33 at the same time. The tubular holder 33 typically serves as an electrode for establishing contact with a ground line.

Figure 13:
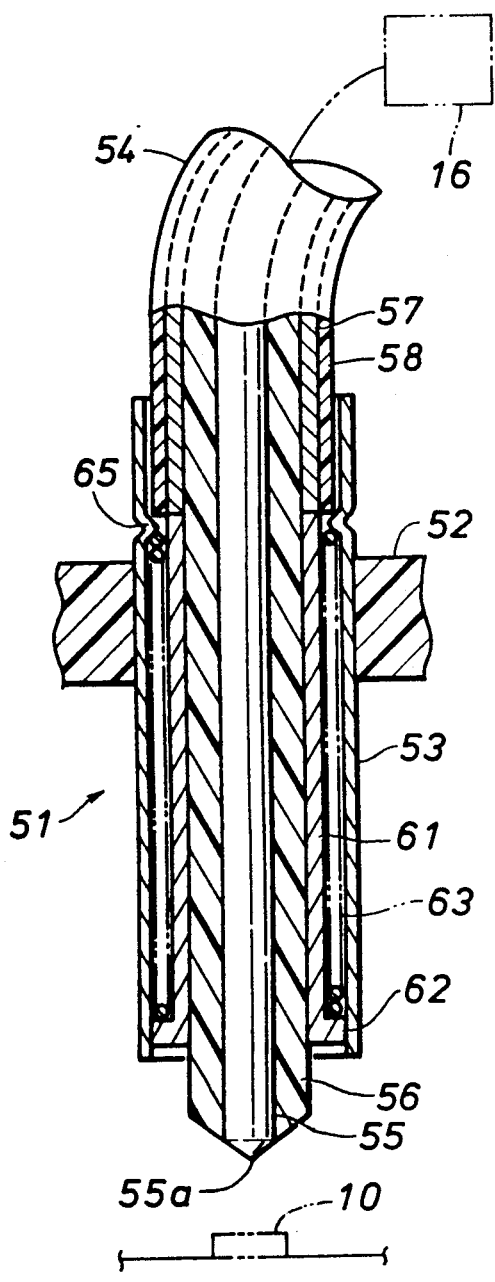
FIGS. 13 and 14 are vertical sectional views of an eighth embodiment of the present invention in two different states.
Figure 14:
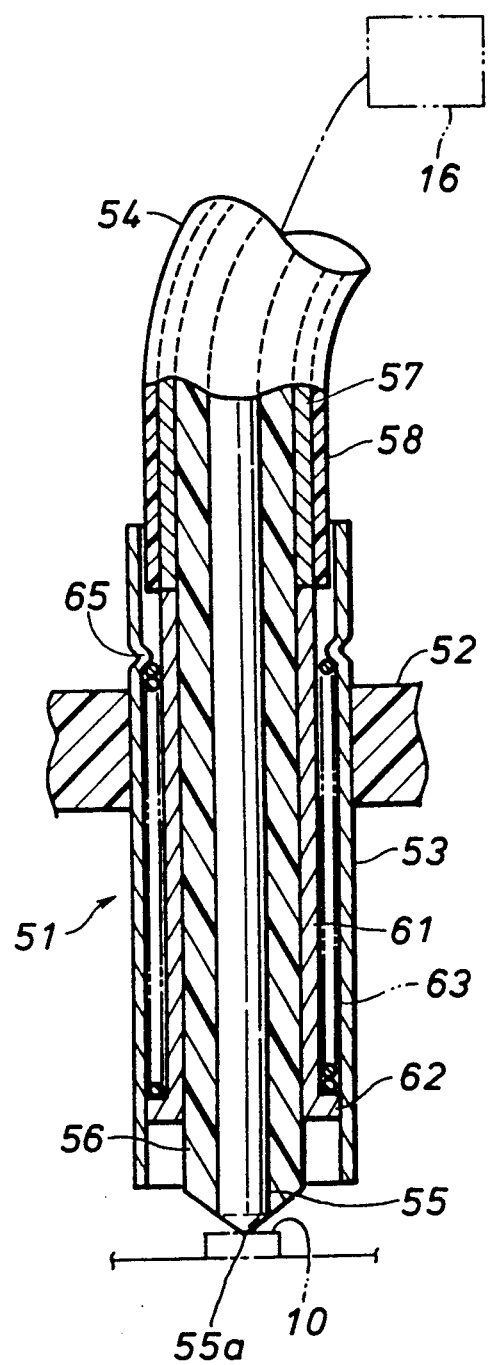

FIGS. 13 and 14 show an eighth embodiment of the present invention. In this contact probe 51, a tubular holder 53 is passed through and fixedly secured to a base board 52 made of an insulating material and forms a part of a contact probe head. The tubular holder 33 receives therein an end of a coaxial cable 54 which is connected to an external testing circuit 16. This coaxial cable 54 comprises a core wire 55, an insulator 56 surrounding the core wire 55, an outer conductor 57 for electromagnetic shielding surrounding the insulator 56, and an outer sheath 58 made of insulating material surrounding the outer conductor 57.

The outer sheath 58 and the outer conductor 57 are removed from a front part of the cable 54 which is received in the tubular holder 53, and the core wire 55 and the insulator 56 extend all the way through the tubular holder 53. A metallic sleeve 61 is fitted substantially over the entire length of the exposed part of the insulator 56. The rear end of the metallic sleeve 61 abuts the front end of the outer conductor 57, and the front end of the metallic sleeve 61 is provided with an annular shoulder 62 formed as a flange. The tubular holder 53 is provided with another annular shoulder 65 formed as a local small diameter portion. A compression coil spring 63 is wound around the metallic sleeve 61 and is compressed between the two annular shoulders 65 and 62. The front ends of the core wire 55 and the insulator 56 surrounding it are shaped as a common conical shape.

In this embodiment also, the compression coil spring 63 is pre-stressed and a single continuous core wire 55 serves both as a needle member and as a lead wire.

Figure 15:
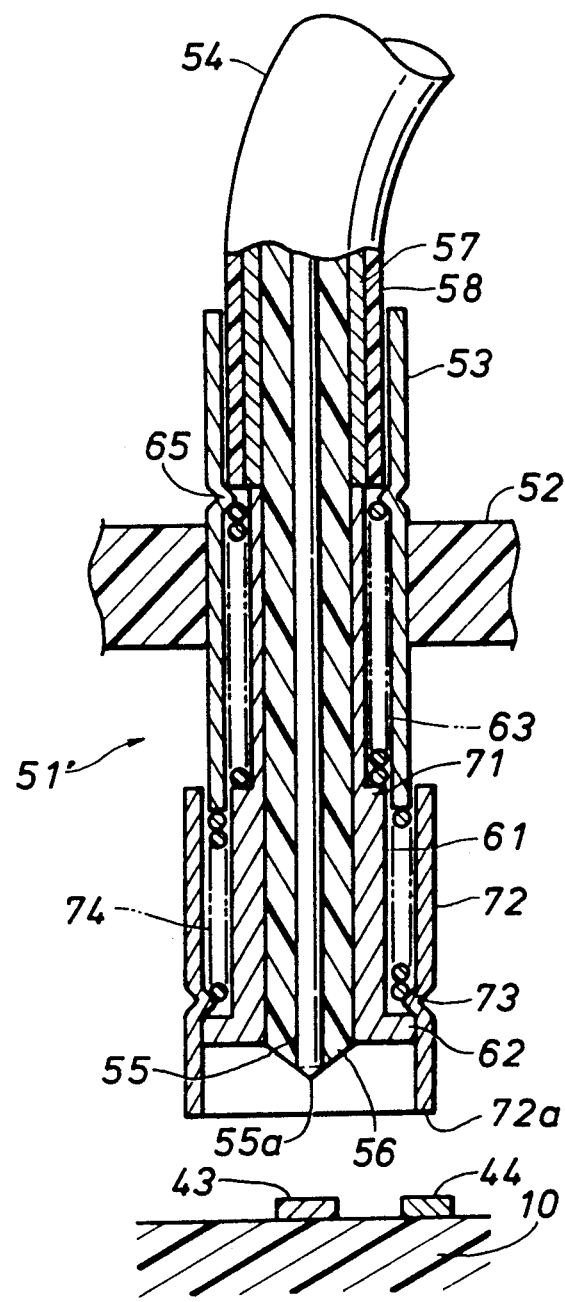

FIG. 15 shows a ninth embodiment of the present invention which is similar to the embodiment illustrated in FIGS. 13 and 14. According to this embodiment, the metallic sleeve 61 is provided with a pair of annular shoulders 71 and 62 at its middle part and at its front end, respectively. The part of the metallic sleeve 61 extending between the two annular shoulders 71 and 62 is larger in diameter than the part of the metallic sleeve 61 extending between the middle annular shoulder 71 and the rear end of the metallic sleeve 61 which abuts the front end of the outer conductor 57. A first compression coil spring 63 is interposed between an annular shoulder 65 provided in the outer holder 53 and the middle annular shoulder 71 of the metallic sleeve 61 so as to urge the cable 54 downwards. The front end of the external sheath 58 limits the downward movement of the cable 54 by abutting the annular shoulder 65 of the tubular holder 53.

A tubular electrode 72 is fixedly fitted on the flange provided in the front end of the metallic sleeve 71. The tubular electrode 72 has an inner diameter which is slightly larger than the outer diameter of the tubular holder 53 so that the former may receive the latter therein in a telescopic manner. An annular shoulder 73 is provided in a middle part of the tubular electrode 73, and a second compression coil spring 74 is wound around the metallic sleeve 61, interposed between the front end of the tubular holder 52 and the annular shoulder 73 of the tubular electrode 72.

When this contact probe is held freely or in its neutral state, the front end 55a of the core wire 55 is hidden behind the front end 72a of the tubular electrode 72 as shown in FIG. 15. When this contact probe 51' is brought into contact with a circuit board 10, the tubular electrode 72 first comes into contact with a part 44 of the printed circuit board 10 and the second compression coil spring 74 is compressed according to the pressure at which the tubular electrode 72 is pressed against the part 43 of the printed circuit board as shown in FIG. 16.

When the second compression coil spring 74 is sufficiently compressed by further pressing the contact probe 51' against the printed circuit board 10, the front end of the core wire 55 comes into contact with the other part 43 of the printed circuit board 10 and the first compression coil spring 63 is also ultimately compressed as shown in FIG. 17. In this state, as the compression coil springs 63 and 74 are both compressed, suitable contact pressures are produced both at the front end 55a of the core wire 55 and at the front end 72a of the tubular electrode 72. Since the compression coil springs 63 and 74 are both compressed even in the neutral state of the contact probe 51', suitable biasing properties can be achieved for both the core wire 55 and the tubular electrode 72. The electric connection of the tubular electrode 72 with the outer conductor 57 is achieved via the compression coil springs 63 and 73, the tubular holder 53, and the metallic sleeve 61.

Figure 18:
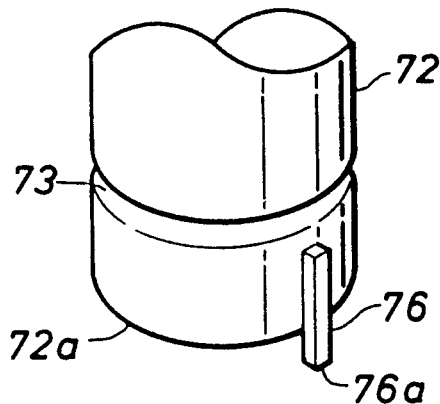
FIG. 18 is an enlarged perspective view of a part of a tenth embodiment.
Figure 19:
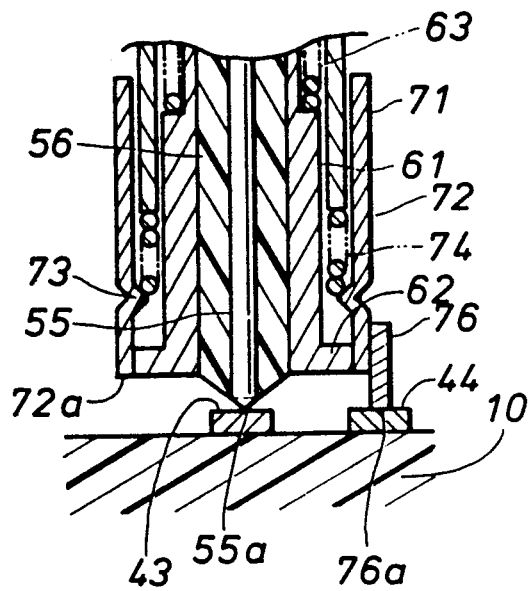
FIG. 19 is a fragmentary vertical sectional view of the tenth embodiment.

As shown in FIG. 18 showing a tenth embodiment of the present invention, an electroconductive rod 76 may be attached to the tubular electrode 72 so as to have the rod 76 project axially from the front end 72a of the tubular electrode 72. In this case, when the front end 76a of the rod 76 is brought into contact with the printed circuit board 10, the remaining part of the front end 72a of the tubular electrode 72 is spaced apart from the printed circuit board 10 even when the core wire 55 and the rod 76 are both brought into contact with appropriate parts 43 and 44 of the printed circuit board 10 as illustrated in FIG. 19, and an inadvertent contact of the tubular electrode 71 with other parts of the printed circuit board 10 can be avoided.

Figure 20:
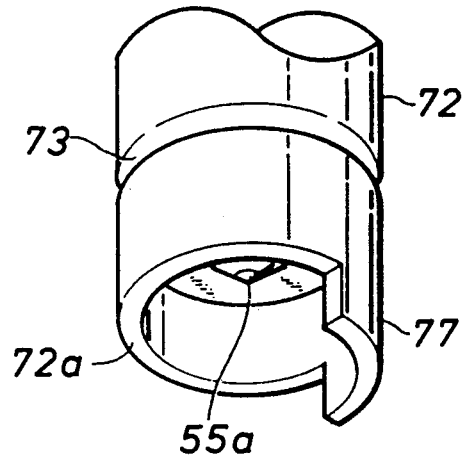
FIG. 20 is a view similar to FIG. 18 showing an eleventh embodiment of the present invention.

Alternatively, as illustrated as an eleventh embodiment of the present invention in FIG. 20, a part of the front end 72a of the tubular electrode 72 in the form of an extension 77 may project integrally therefrom. In this case also, the extension 77 can selectively contact a desired point of the printed circuit board.

FIGS. 21 through 24 show a twelfth embodiment of the present invention which is similar to the ninth embodiment shown in FIGS. 15 through 17.

In the preceding embodiments, the front end of the core wire or the needle member was used either as it is or in its sharpened state, but it is also possible to attach a separate tip to the free end of the core wire or the needle member to achieve a favorable contact with a point that is to be accessed. In this embodiment, the cable consists of a normal coaxial cable, and its core wire 55 is not made of any particularly hard or rigid material. Therefore, a crown shaped tip 93 having four pointed ends 94 is fitted on the exposed front end of the core wire 55. This tip may be made of suitable material such as beryllium having a favorable electric contact property. Alternatively, the tip may be made of hard and rigid material such as tungsten. In either case, the tip may be coated with gold by vapor deposition, iron plate, sputtering or other suitable means.

Figure 23:
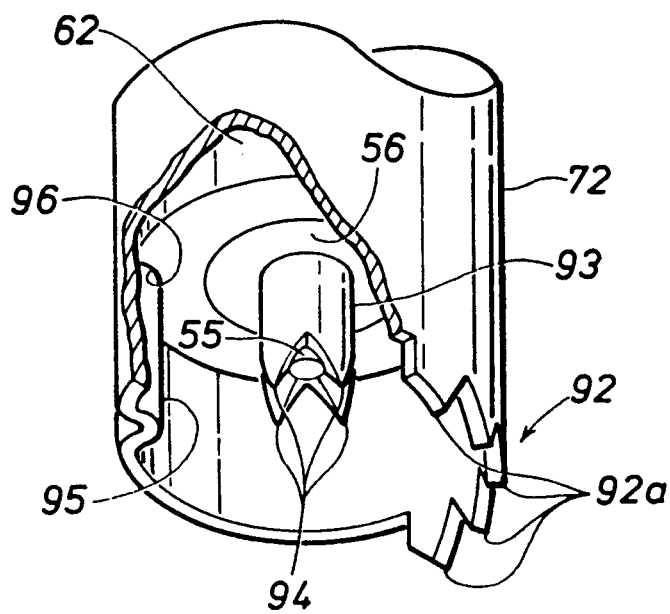
FIG. 23 is a partly broken-away perspective view of a part of the twelfth embodiment.

As best shown in FIG. 23, the tubular electrode 72 is provided with an axial extension 92 extending from the front end thereof, and its front end is provided with notches to define a few sharp teeth 92a to ensure a favorable contact. Also, a front end of the tubular electrode 72 is inwardly depressed along an axial line defining a ridge 95 which engages with a complementary notch 96 provided in the flange 62 provided in the front end of the metallic sleeve 61 to prevent the tubular electrode 72 from rotating relative to the other part of the contact probe 51".

Figure 24:
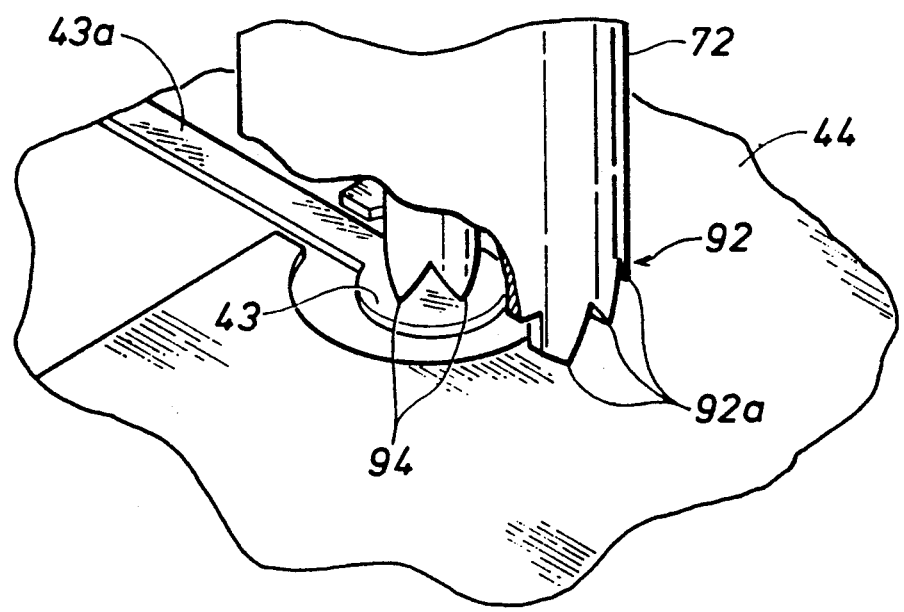
FIG. 24 is a partly broken-away perspective view of the twelfth embodiment illustrating the way it is applied to a printed circuit board.

According to this embodiment, when a small disk-shaped electro-conductive pattern 43 and a substantially annular electro-conductive pattern 44 surrounding it except for its linear lead piece 43a extending therefrom are to be accessed with the contact probe 51" of the present embodiment as illustrated in FIG. 24, since the tubular electrode 72 is prevented from rotating, it is possible to accurately access these two parts of the printed circuit board. Also, the pointed ends of the tip 93 and the extension 92 can break and penetrate any oxide film or flux layer which may exist on the surfaces of the printed patterns, and ensure reliable electric contacts.

FIG. 25 illustrates an embodiment of the contact probe head which may be used to mount the contact probes described. This contact probe head 100 comprises a casing 101 including a base board 102, a guide plate 103 which can move linearly toward and away from a base board 102 guided by four guide rods 105 which are integrally attached to the guide plate 103 at their base ends and passed through associated holes 104 provided in the base board 102. A plurality of compression coil springs 107 are interposed between the guide plate 103 and the base board 102 to urge the guide plate 103 away from the base board 102, and the free ends of the guide rods 105 are provided with enlarged heads 105a to limit the movement of the guide plate 103 away from the base board 102. An array of contact probes 106 are passed through and fixedly secured to the base board 102, and the guide plate 103 is provided with a plurality of holes 103a which align with the associated contact probes 106. Lead wires 108 extending from the contact probes 106 are connected to a female connector 109 mounted on a side wall 110 of the casing 101, and a male connector 111 leading to a testing circuit not shown in the drawing is coupled with the female connector 109.

In neutral state of the contact probe head 100, the front ends of the contact probes 106 are received in the holes 103a and are protected from damages by these holes 103a. When this contact probe head 100 is applied to a circuit to be tested, the guide plate 103 is brought into contact with a guide block not shown in the drawings, and the front ends of the contact probes 106 are exposed by the movement of the guide plate 103 toward the base board 102 against the biasing force of the compression coil springs 107, and the contact probes 106 are brought into contact with desired parts of the circuit to be tested.

What I claim is:

1. A contact probe, comprising:
   an elongated electroconductive needle member having a forward end, said needle member having a smooth, uninterrupted exterior surface;
   a tubular holder having an open end, said tubular holder slidably receiving said needle member;
   a compression coil spring coiled around said needle member whereby said needle member can slide within said coil spring, said coil spring having a first portion thereof engaged with said tubular holder and a second portion thereof secured to said needle member to thereby urge the forward end of said needle member to project from said open end of said tubular member;
   stopper means secured to said needle for restricting the extent to which said forward end of said needle member projects from said open end of said tubular holder; and
   lead means for electrically connecting said needle member to an external circuit.

2. A contact probe according to claim 1, wherein said lead means consists of a continuous and integral extension of said needle member.

3. A contact probe according to claim 1, wherein said other end of said compression coil spring is tightly wrapped around said needle member to securely engage said other end of said compression coil spring with said needle member.

4. A contact probe according to claim 3, wherein said stopper means comprises a stopper member securely fitted on said needle member and a stopper portion of said tubular holder formed as an annular shoulder so as to cooperate with said stopper member.

5. A contact probe according to claim 4, wherein said stopper member consists of a piece of wire tightly wrapped around said needle member.

* * * * *